United States Patent [19]

Copeland et al.

[11] Patent Number: 5,783,771
[45] Date of Patent: Jul. 21, 1998

[54] EMI CHASSIS SEAM

[75] Inventors: Jeffrey P. Copeland, Jefferson; Dennis C. Robinson, Marlboro, both of Mass.

[73] Assignee: Digital Equipment Corporation, Maynard, Mass.

[21] Appl. No.: 550,787

[22] Filed: Oct. 6, 1995

[51] Int. Cl.$^6$ ............................................ H05K 9/00
[52] U.S. Cl. ................... 174/35 R; 361/683; 361/816; 361/800; 361/796
[58] Field of Search ................ 174/35 R; 361/683, 361/684, 685, 725, 727, 816, 818, 753, 799, 800, 741, 802, 752, 796, 756

[56] References Cited

U.S. PATENT DOCUMENTS

| | | | |
|---|---|---|---|
| 4,759,466 | 7/1988 | Chase et al. | 220/306 |
| 4,916,578 | 4/1990 | Mast | 361/424 |
| 4,977,532 | 12/1990 | Borkowicz et al. | 361/683 |
| 5,004,866 | 4/1991 | Cooke et al. | 174/35 GC |
| 5,043,528 | 8/1991 | Mohr | 174/35 GC |
| 5,278,351 | 1/1994 | Herrick | 174/35 R |
| 5,305,180 | 4/1994 | Mitchell et al. | 361/685 |
| 5,347,430 | 9/1994 | Curlee et al. | 361/816 |
| 5,349,483 | 9/1994 | Tsai | 361/685 |
| 5,392,192 | 2/1995 | Dunn et al. | 361/683 |
| 5,419,629 | 5/1995 | Korinsky | 312/263 |
| 5,420,760 | 5/1995 | Ansell et al. | 361/818 |

*Primary Examiner*—Kristine L. Kincaid
*Assistant Examiner*—Hung V. Ngo
*Attorney, Agent, or Firm*—A. Sidney Johnston; Michael A. Rodriguez

[57] ABSTRACT

The invention relates to an enclosure for computers that is formed by slidably joining together two chassis portions. A groove formed in a wall of one chassis portion mates with a tongue formed in a wall of the other chassis portion. The tongue enters one end of the groove and slides throughout the groove's length until the two chassis portions become fully joined and form a completed enclosure. The combination of the tongue and groove forms a slidable tongue and groove joint. When both chassis portions are made of electrically conductive material, the tongue and groove joint effectively inhibits the passage of electromagnetic radiation through the seam that forms at the juncture of the two chassis portions.

25 Claims, 20 Drawing Sheets

EMI CHASSIS SEAM

FIELD OF THE INVENTION

This invention relates generally to enclosures for computers, and, more particularly, to enclosures that shield electromagnetic interference (EMI) emitted by electronic components housed within.

BACKGROUND OF THE INVENTION

Computer manufacturers look to reduce costs and shorten manufacturing times for assembling their computers. Reducing the number of pieces required to form a complete enclosure is one way to simplify an enclosure's manufacturing process. A practical enclosure design may use as few as two chassis portions. However, an enclosure using only two chassis portions may be difficult to achieve without making significant design compromises. A two-portion design may produce an enclosure that lacks structural strength, use complicated latching and separating mechanisms, require an over-abundance of fasteners, produce an ineffective seal between chassis portions, or scale poorly when applied to larger or smaller enclosures. The design difficulty increases when the desired two-portion computer enclosure must also shield electromagnetic radiation.

With computers now achieving clock frequencies of 275 MHz and more, and their digital circuits now operating with signal rise times of less than a nanosecond, electronic components may emit electromagnetic radiation in excess of 1 GHz. Unless properly shielded, this radiation can interfere with the intended performance of other electronic devices within range.

The Federal Communciations Commission (FCC) has placed limits on the permissible amount of electromagnetic emissions from an electronic device. To comply with these limits it has become necessary to shield the device's electronic components within a sealed enclosure made of conductive material.

Typically, a sealed enclosure comprises separable chassis portions, which, upon their subsequent joining, form seams. These seams compromise the enclosure's shielding integrity by introducing gaps at the interface between the chassis or by increasing the electrical resistivity across the interface. Such seams become avenues for leaking electromagnetic radiation.

To restore the shield's integrity, industry employs various techniques, including seam welding around the enclosure periphery, seam crimping, rivets, and epoxied mesh gaskets. But these techniques are acceptable only if the chassis portions do not have to be separated.

For separable chassis portions, temporary bonding mechanisms between chassis portions have to be employed. Industry's solutions again are various. The solutions involve fasteners, screws, brackets, hinges, spring devices, highly conductive gaskets or finger stocks. Such mechanisms complicate the manufacturing process and increase product expense.

Finger stocks, a commonly employed solution, has additional associated shortcomings. When properly mounted they produce an effective EMI shielding seam, but lack robustness. With repeated disengagements and engagements between chassis portions, finger stocks can become deformed or damaged and lose their shielding effectiveness.

Also, the effectiveness of finger stocks depends upon their proper compression, and whether that proper compression can be maintained along the entire seam for the lifetime of the product. Inadequate compression leaves gaps in the seam, yet too much compression can permanently deform the fingers and make them inadequate for future shielding after the chassis portions disengage.

Accordingly, room remains for an improved arrangement that joins separable chassis protions to form an effective EMI shielding enclosure yet avoids the problems of the aforementioned solutions.

SUMMARY OF THE INVENTION

The invention is an enclosure that is formed by slidably joining together two chassis portions. A groove formed in a wall of one chassis portion mates with a tongue formed in a wall of the other chassis portion. The tongue enters one end of the groove and slides throughout the groove's length until the two chassis portions become fully joined and form a completed enclosure. The combination of the tongue and groove forms a slidable tongue and groove joint. When both chassis portions are made of electrically conductive material, the tongue and groove joint effectively inhibits the passage of electromagnetic radiation through the seam that forms at the juncture of the two chassis portions.

Other and further aspects of the present invention will become apparent in the course of the following description and by reference to the accompanying drawings.

BRIEF DESCRIPTION OF THE DRAWINGS

Referring now to the drawings in which like numerals represent like parts in the several views.

DETAILED DESCRIPTION

Mechanical Structure

Figure 1:
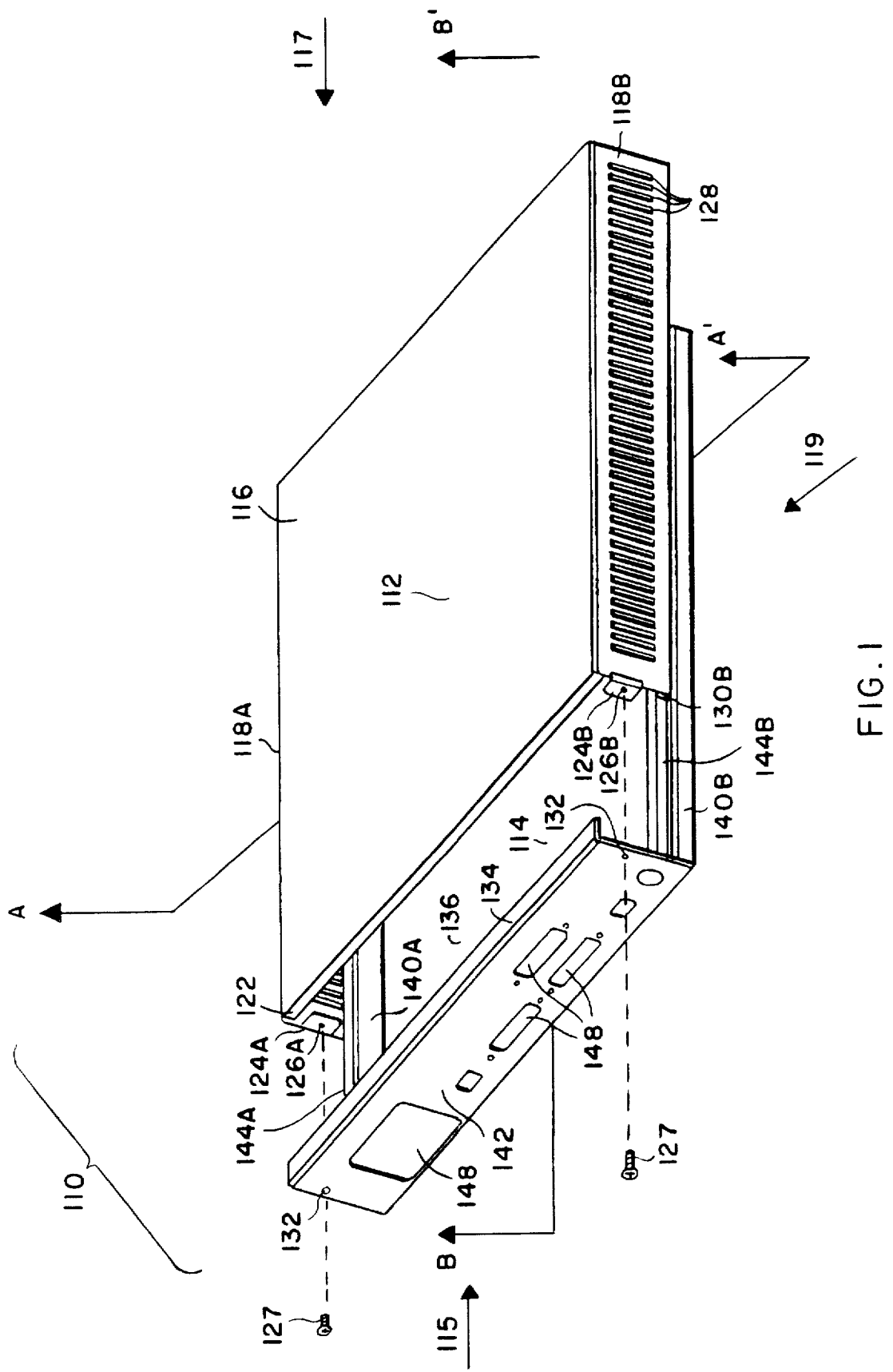
FIG. 1 is an isometric view of a cover chassis and a base chassis partially joined.

Referring now to FIG. 1, there is shown a first exemplary embodiment of the invention. In FIG. 1, a partially closed enclosure 110 is shown. Enclosure 110 comprises a first chassis portion or cover 112 and a complementary second chassis portion or base 114. Cover 112 and base 114 are each made of electrically conductive, pliable material, such as, for examples, a single sheet of metal or plated plastic. A manufacturing advantage results in that completed enclosure 110 can be formed using as few as two parts. A completely closed enclosure 110 inhibits the escape of electromagnetic radiation emitted by computer components, such as electronic components, housed within the enclosure 110.

Figure 2:
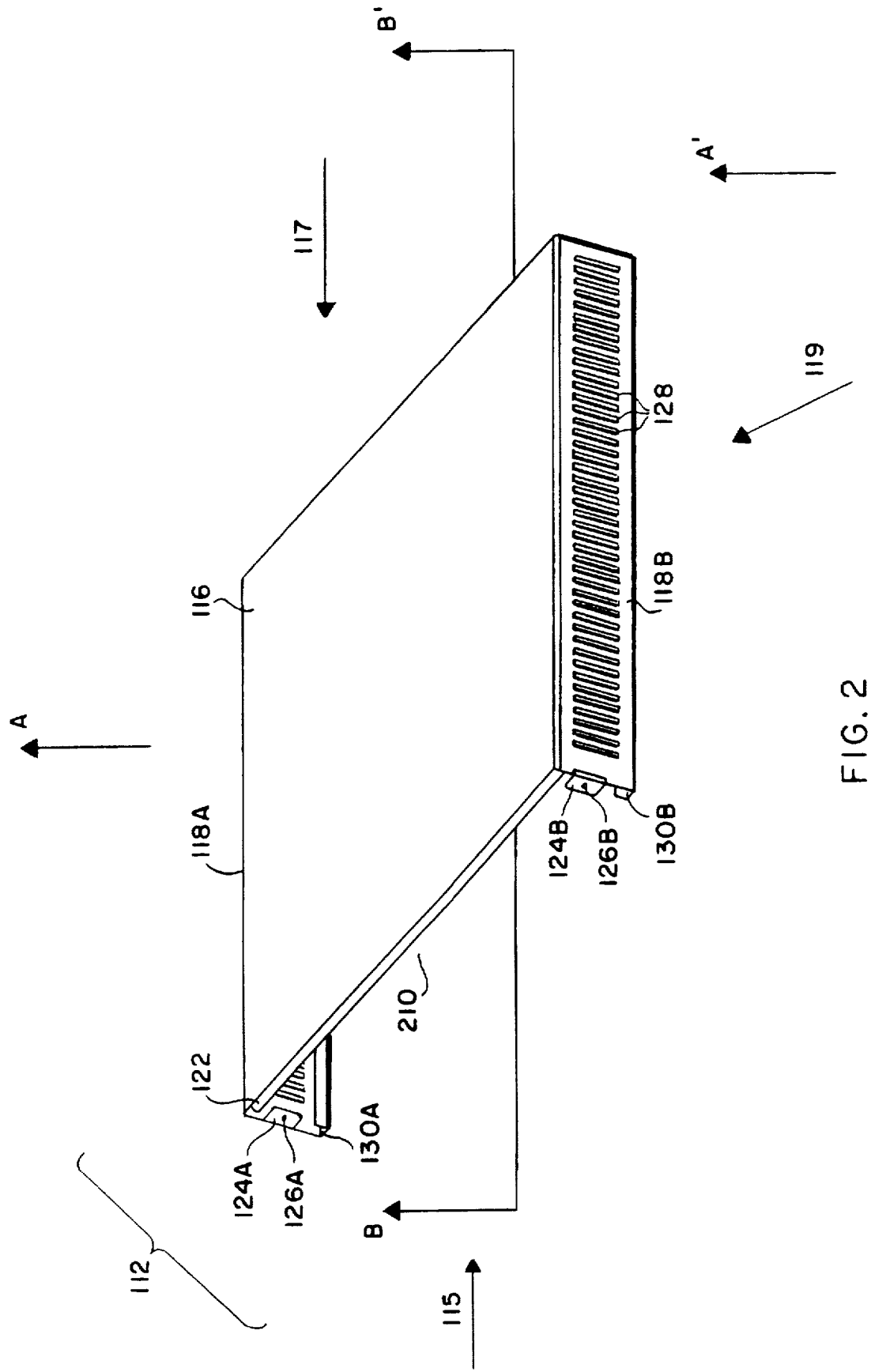
FIG. 2 is an isometric view of the cover chassis in FIG. 1.
Figure 3:
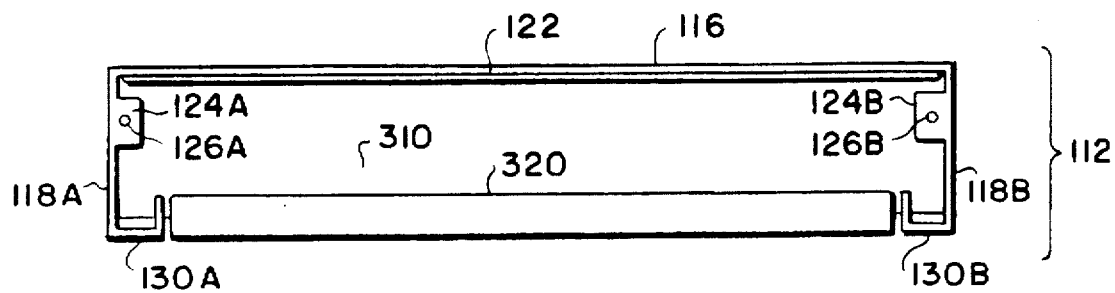
FIG. 3 is a back end view of the cover chassis in FIG. 1.
Figure 4:
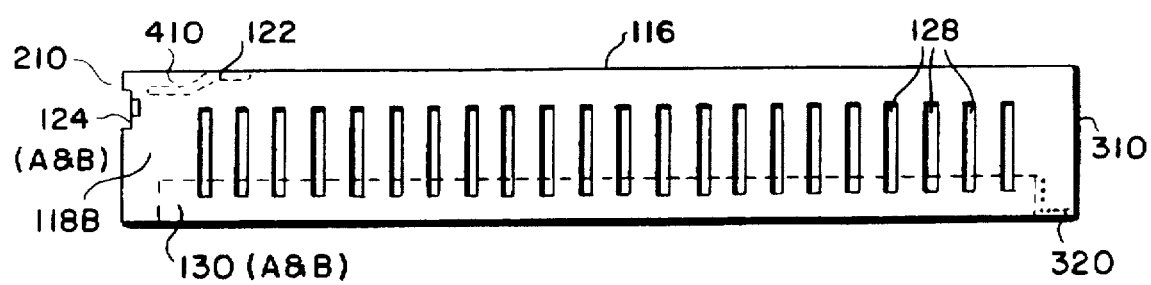
FIG. 4 is a side view of the cover chassis in FIG. 1.

Referring now to FIGS. 1–4: FIG. 2 is an isometric view of cover 112; FIG. 3 is a rear view, as indicated by arrow 115, of cover 112; and FIG. 4 is a side view, as indicated by arrow 119, of cover 112. Cover 112 comprises two side walls 118A, 118B and a front wall 310 attached to a top wall 116. An opening 210 is formed. At opening 210, a metal blade 122 is mounted on the underside of top wall 116. Instead of being a separate part mounted to the underside of top wall 116, blade 122 can be formed from and an extension of top wall 116. Blade 122 substantially spans the width of the opening 210. An open-ended gap 410 is formed between top wall 116 and blade 122. The open end of gap 410 faces opening 210.

At opening 210, each side wall 118A, 188B has a tab 124A, 124B folded perpendicular to a side wall 118A, 118B respectively. Each tab 124A, 124B has a screw hole 126A, 126B, respectively, located centrally therein. Each side wall 118A, 118B also has a plurality of vertical slots 128 for ventilation, although such slots 128 are not necessary to practice the present invention. Slots 128 may have any shape, such as, for example, circular.

Figure 19:
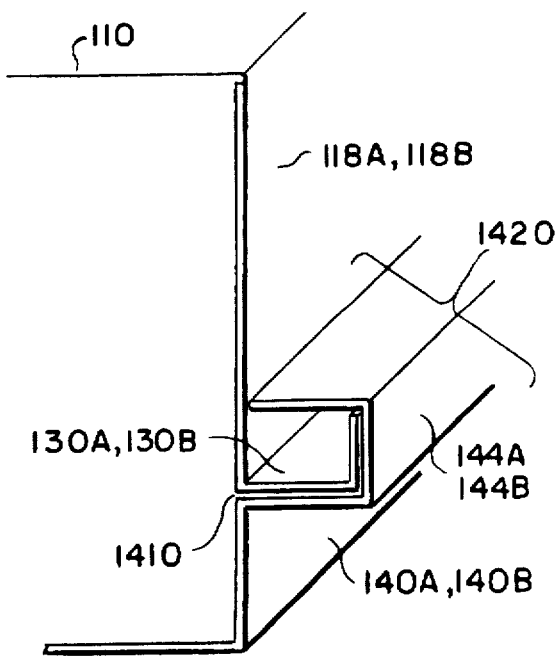
FIG. 19 is an isometric section view of another alternative tongue and groove joint.

Through a process of bending cover 112, a tongue 130A, 130B is formed on each side wall 118A, 118B respectively. Tongue 130A, 130B extends substantially the length of side wall 118A, 118B. This embodiment has tongue 130A, 130B formed at the bottom of side wall 118A, 118B facing the interior of cover 112. As alternatives, side wall 118A, 118B can extend below tongue 130A, 130B, as shown in alternative embodiment 1 (FIG. 16), and tongue 130A, 130B can be formed facing the exterior of cover 112 as shown in alternative embodiment 4 (FIG. 19).

Figure 16:
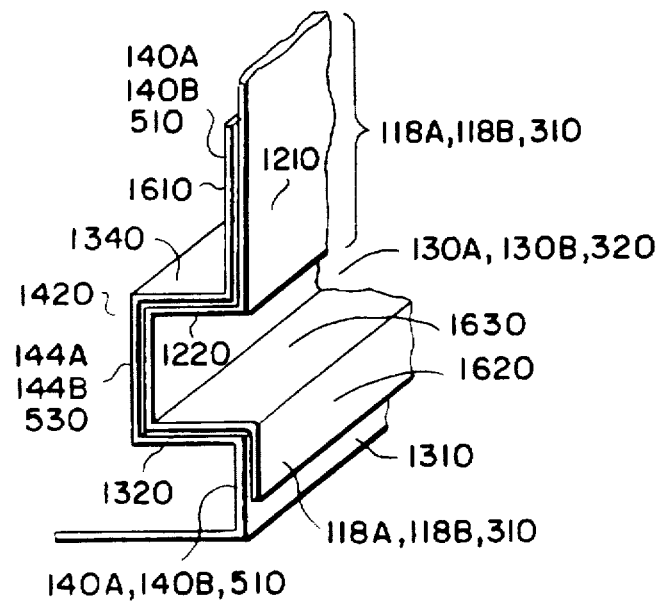
FIG. 16 is an isometric section view of an alternative tongue and groove joint.

Also through the process of bending cover 112, a tongue 320 is formed on front wall 310. Tongue 320 extends substantially the width of front wall 310. In this embodiment, tongue 320 has a form substantially equivalent to that of tongue 130A, 130B and is formed at the bottom of front wall 310 facing the interior of cover 112. As an alternative, front wall 310 can extend below tongue 320 as shown in alternative embodiment 1 (FIG. 16).

Figure 6:
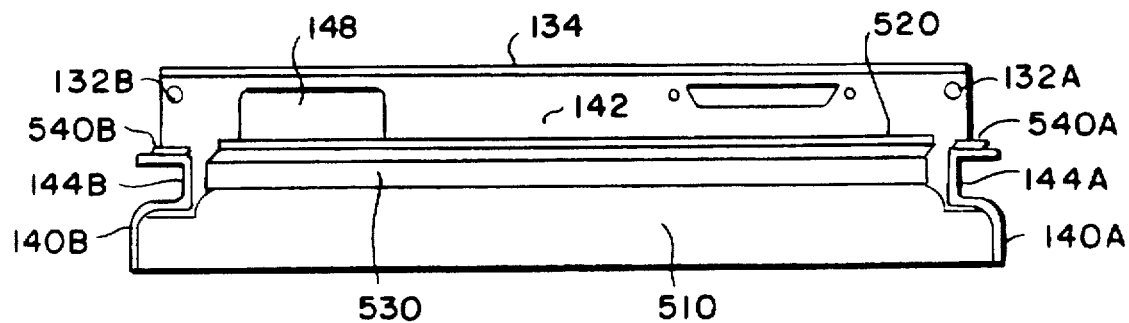
FIG. 6 is a front end view of the base chassis in FIG. 1.
Figure 5:
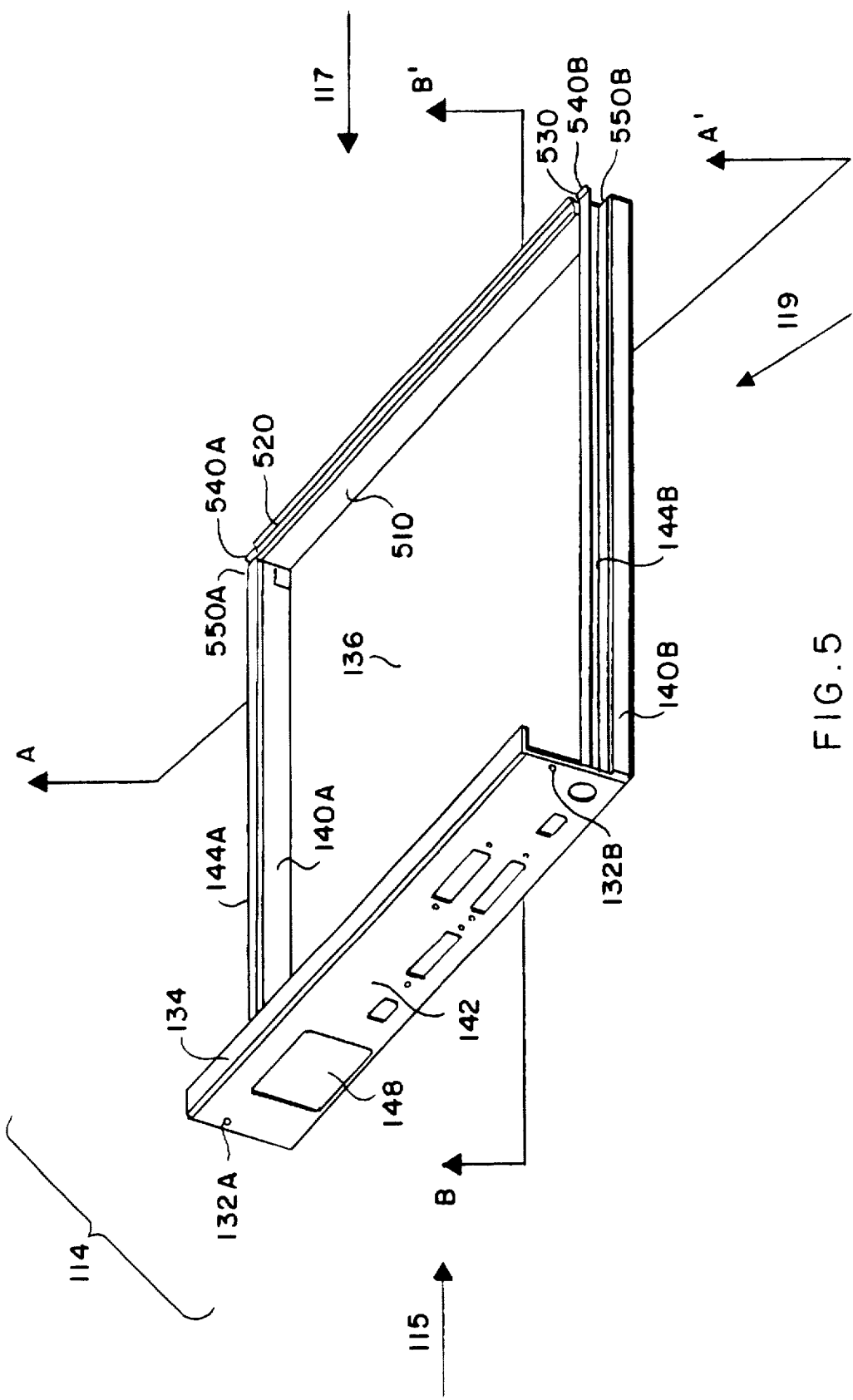
FIG. 5 is an isometric view of the base chassis in FIG. 1.

Referring now to FIGS. 1, 5 and 6: FIG. 5 is an isometric view of base 114, and FIG. 6 is a front view, as indicated by arrow 117, of base 114. Base 114 comprises a front wall 510, two side walls 140A, 140B, and a rear wall 142 attached to a bottom wall 136.

Through a process of bending base 114, a groove 144A, 144B is formed in the exterior surface of each side wall 140A, 140B respectively, for slidably receiving a corresponding tongue 130A, 130B of side wall 118A, 118B of cover 112. Groove 144A, 144B extends substantially the length of side wall 140A, 140B, respectively.

In this embodiment, groove 144A, 144B is formed at the top of the side wall 140A, 140B facing the exterior of base 114. As alternatives, side wall 140A, 140B can extend above groove 144A, 144B, as shown in alternative embodiment 1 (FIG. 16), and groove 144A, 144B can be formed facing the interior of base 114 as shown in alternative embodiment 4 (FIG. 19).

Returning now to FIGS. 1, 5 and 6, also through the process of bending base 114, a groove 530 is formed in the exterior surface of front wall 510. The groove 530 extends substantially the width of front wall 510.

Figure 7:
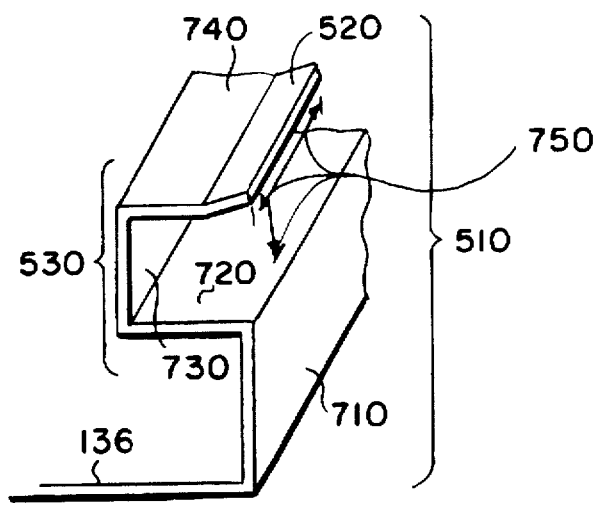
FIG. 7 is a section view of the front groove on the front end of the base chassis.

Referring now to FIGS. 3, 5, and 7: FIG. 7 shows a detail view of groove 530. Groove 530 is aligned with tongue 320 on front wall 310 of cover 112 so as to closely receive tongue 320 when cover 112 and base 114 are completely slidably joined. Groove 530 has an upturned front edge 520 for easier guiding of tongue 320 into groove 530. This embodiment has groove 530 formed at the top of front wall 510. As an alternative, front wall 510 can extend above groove 530 as shown in the alternative embodiment 1 (FIG. 16).

Figure 8:
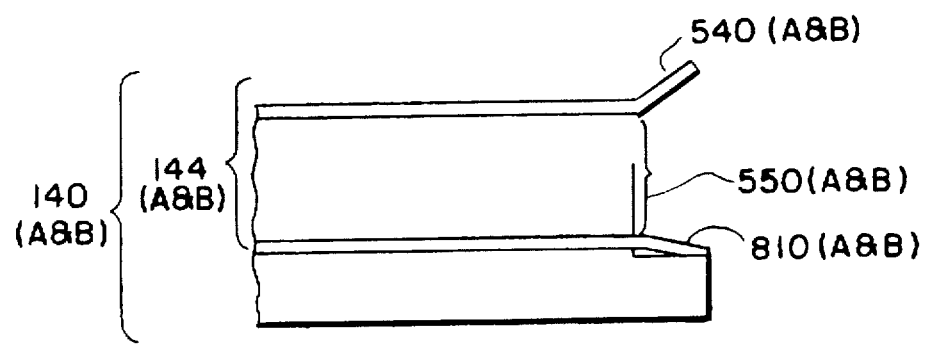
FIG. 8 is a section view of a side groove at the front end of the base chassis.

Referring briefly to FIGS. 5 and 8: FIG. 8 provides a more detailed illustration of groove 144A, 144B at groove entrance 550A, 550B. Groove 144A, 144B has an upward beveled portion 540A, 540B and a downward beveled portion 810A, 810B at groove entrance 550A, 550B at the front of base 114 for easier guiding of corresponding tongue 130A, 130B into groove 144A, 144B when initially aligning and joining cover 112 to base 114.

Returning to FIGS. 1, 4, 5 and 6, a lip 134 extends from the top of rear wall 142 substantially at a right angle. Lip 134 presses into gap 410 as cover 112 and base 114 are assembled together. Screw holes 132 on rear wall 142 are aligned to screw holes 126A, 126B on tabs 124A, 124B of side walls 118A, 118B for removably fastening cover 112 to base 114 with screws 127. Rear wall 142 further comprises apertures 148 for making input/output connections to electronic parts mounted within enclosure 110.

Figure 9:
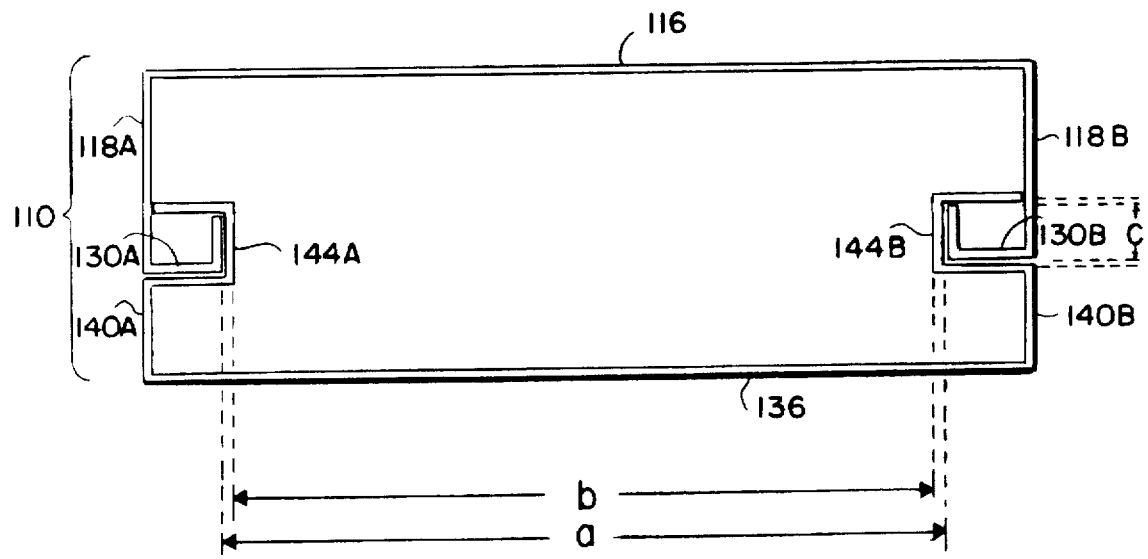
FIG. 9 is a cross section view along line AA' in FIG. 1 of the cover and base joined together.

Referring now to FIGS. 1 and 9, FIG. 9 is a view, as indicated by arrow 115, of cross section AA' of enclosure 110. FIG. 9 shows how grooves 144A, 144B closely receive corresponding tongues 130A, 130B as cover 112 and base 114 are slidably joined.

Figure 10:
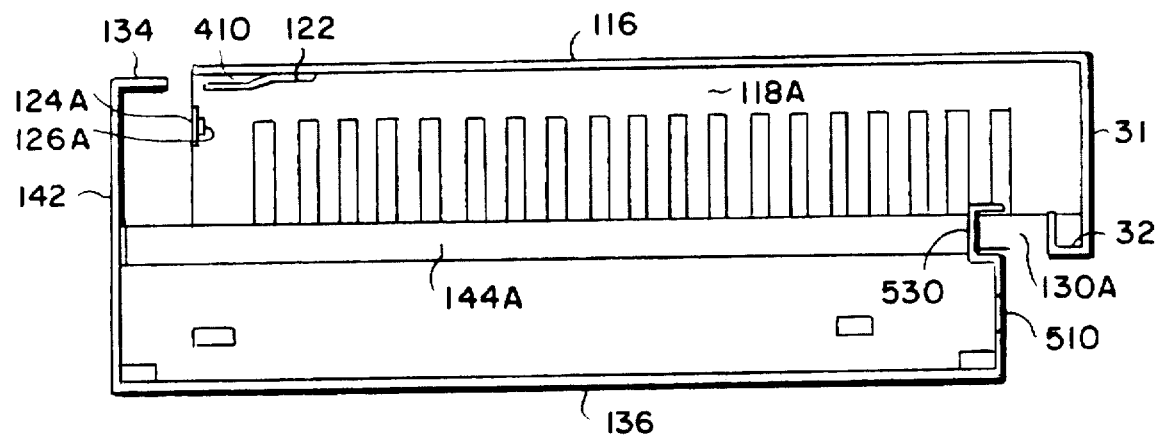
FIG. 10 is a cross section view along line BB' in FIG. 1 of the cover chassis and base chassis partially joined together.

Referring now to FIGS. 1 and 10: FIG. 10 is a view, as indicated by arrow 119, of cross section BB' of enclosure 110. FIG. 10 shows tongue 320 on front wall 310 of cover 112 about to push into groove 530 in front wall 510 of base 114. Also shown is lip 134 of rear wall 142 about to enter gap 410.

Figure 11:
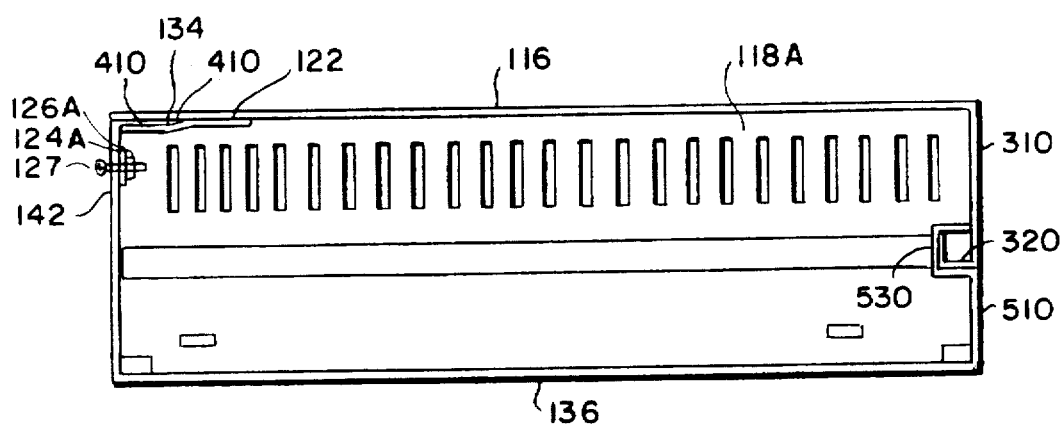
FIG. 11 is a cross section view along line BB' in FIG. 1 of the cover chassis and base chassis fully joined together.

Referring now to FIGS. 1 and 11: FIG. 11 is a side view cross section BB', as indicated by arrow 119, of enclosure 110. FIG. 11 shows the final positions of tongue 320 and groove 530 and lip 134 and blade 122 after cover 112 and base 114 are fully joined. As shown, lip 134 is pressed tightly into gap 410 between blade 122 and top wall 116 to form a lip and blade joint 1110. Also shown, tongue 320 is pressed fully and tightly into groove 530. Screws 127 inserted through tab 124 removably fasten the base 114 to the cover 112.

Figure 12:
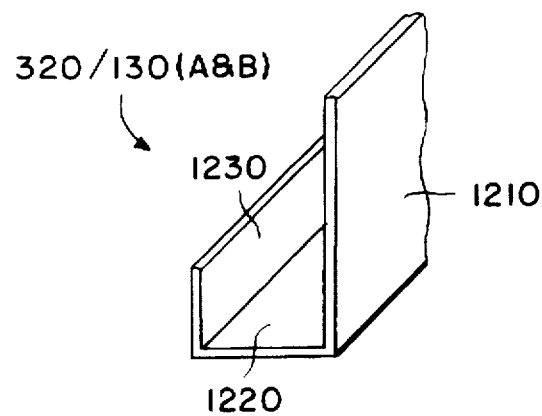
FIG. 12 is a section view of the tongue shown in FIGS. 1–4.

Referring now to FIG. 12, details of tongue 130A, 130B, 320 are shown. Tongue 130A, 130B, 320 are bent into, for example, sheet metal, in similar form. Or, as a further example, the tongues can be formed by plastic injection molding and then plated to make the tongues' surfaces electrically conductive. The tongues comprise an outer wall portion 1210, a lateral tongue portion 1220 extending away from outer wall portion 1210 substantially at a right angle, and an upright tongue portion 1230 extending upwards from lateral tongue portion 1220 substantially at a right angle.

Figure 13:
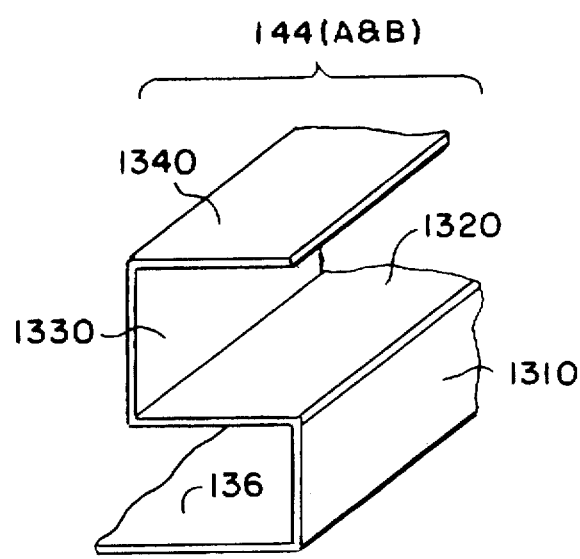
FIG. 13 is a section view of the groove shown in FIGS. 1, 5–8.

Referring now to FIG. 13, details of groove 144A, 144B are shown. Groove 144A, 144B comprises a spacer wall portion 1310 extending upwards from bottom wall 136 substantially at a right angle, a first lateral groove portion 1320 extending away from spacer wall portion 1310 substantially at a right angle, an upright groove portion 1330 extending upwards from lateral groove portion 1320 substantially at a right angle, and a second lateral groove portion 1340 extending away from upright groove portion 1330 substantially at a right angle and laterally spaced apart from and substantially parallel with first lateral groove portion 1320.

Returning now to FIG. 7, details of groove 530 are shown. Groove 530 comprises a spacer wall portion 710 extending upwards from bottom wall 136 substantially at a right angle, a first lateral groove portion 720 extending away from spacer wall portion 710 substantially at a right angle, an upright groove portion 730 extending upwards from lateral groove portion 720 substantially at a right angle, and a second lateral groove portion 740 extending away from upright groove portion 730 substantially at a right angle and laterally spaced apart from and substantially parallel with first lateral groove portion 720. Groove portions 720, 730, 740 define a groove entrance 750. Groove entrance 750 substantially spans the width of front wall 510. Second lateral groove portion 740 has an upturned front edge 520 slanting at an angle away from the groove entrance 750. Upturned front edge 520 facilitates entrance of tongue 320 into groove 530, as shown in the figure sequence FIG. 10–FIG. 11, which show steps in closing of enclosure 110.

Figure 14:
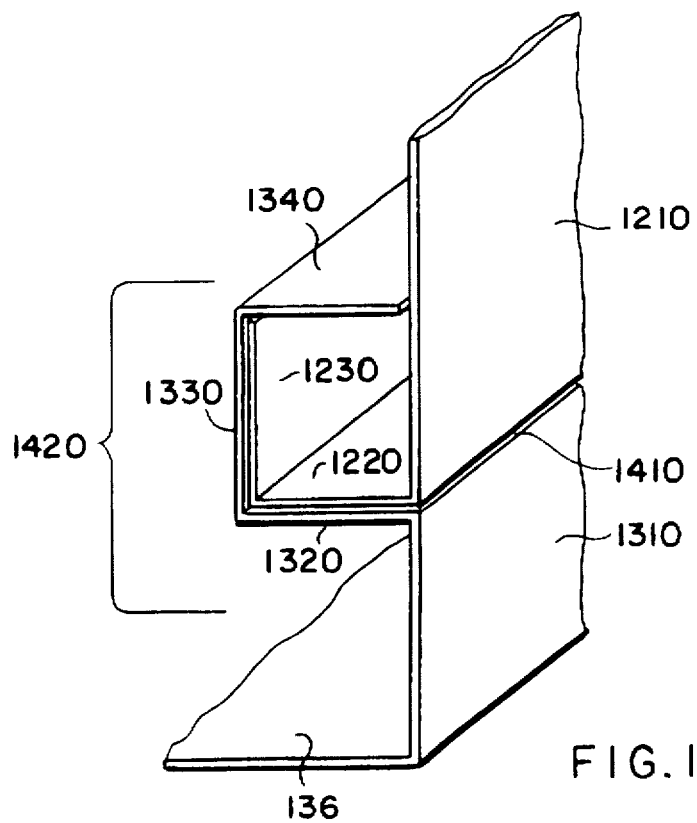
FIG. 14 is a section view of a tongue and groove joint formed at the sides of an enclosure.

Referring now to FIG. 14, the mating surfaces of tongue 130A, 130B with groove 144A, 144B are shown in detail. FIG. 14 shows the downward facing surface of lateral tongue portion 1220 mating with the upward facing surface of first lateral groove portion 1320. Also FIG. 14 shows the inward facing surface of upright tongue portion 1230 mating with the outward facing surface of upright groove portion 1330. The combination of tongue 130A, 130B and groove 144A, 144B form a slidable tongue and groove joint 1420. Tongue and groove joint 1420 possesses an inherent advantage in that it gives rigidity and strength to enclosure 110 because of its beam-like shape and closely-fitting mating surfaces. A seam 1410 is formed along the juncture of cover 112 on base 114 where tongue 130A, 130B and groove 144A, 144B meet.

Figure 15:
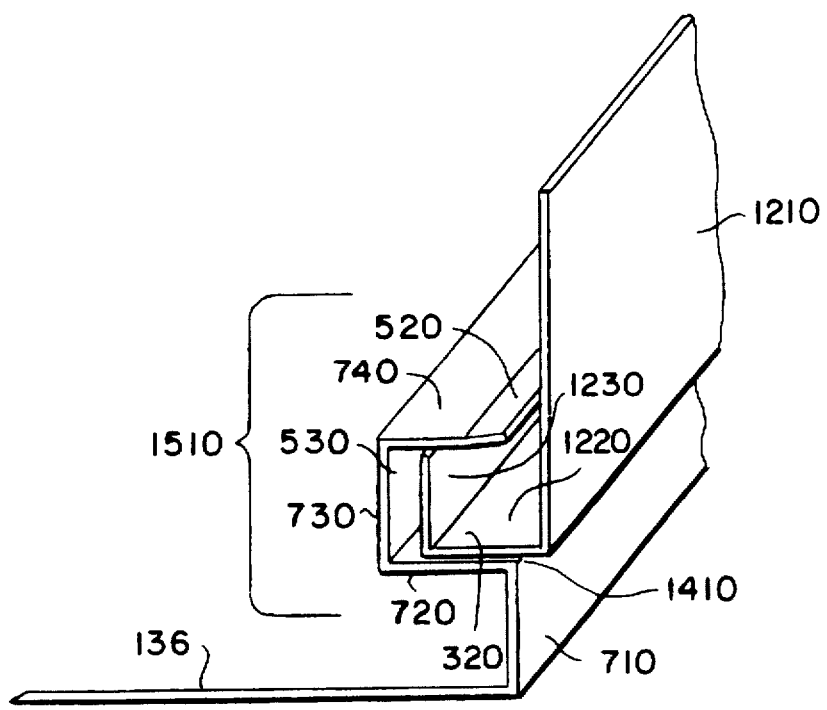
FIG. 15 is a section view of a tongue and groove joint partially formed at the front end of the enclosure.

Referring now to FIG. 15, the mating surfaces of tongue 320 with groove 530 are shown in detail. FIG. 15 shows the downward facing surface of lateral tongue portion 1220 mating with the upward facing surface of first lateral groove portion 720. Also FIG. 15 shows the inward facing surface of upright tongue portion 1230 about to mate with the outward facing surface of upright groove portion 730. The combination of tongue 320 and groove 530 form a pressable tongue and groove joint 1510. A seam 1410 is formed along the juncture of cover 112 on base 114 where tongue 320 and groove 530 meet.

Referring now to FIGS. 16–19, FIGS. 16–19 show alternative embodiments of tongue and groove joint 1420. In FIG. 16, groove wall extension 1610 extends above the groove 144A, 144B, 530 and mates with the inward facing surface of outer wall portion 1210. Tongue wall extension 1620 extends below tongue 130A, 130B, 320 and mates with the outward facing surface of spacer wall portion 1310. FIG. 16 also shows the upward facing surface of lateral tongue portion 1220 mating with the downward facing surface of second lateral groove portion 1340 and the downward facing surface of second lateral tongue portion 1630 mating with the upward facing surface of first lateral groove portion 1320.

Figure 17:
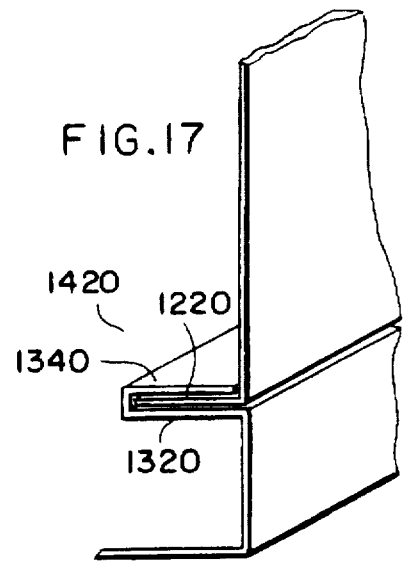
FIG. 17 is an isometric section view of another alternative tongue and groove joint.

In FIG. 17, the alternative embodiment has lateral tongue portion 1220 mating with both the upward facing surface of first lateral groove portion 1320 and with the downward facing surface of the second lateral groove portion 1340.

Figure 18:
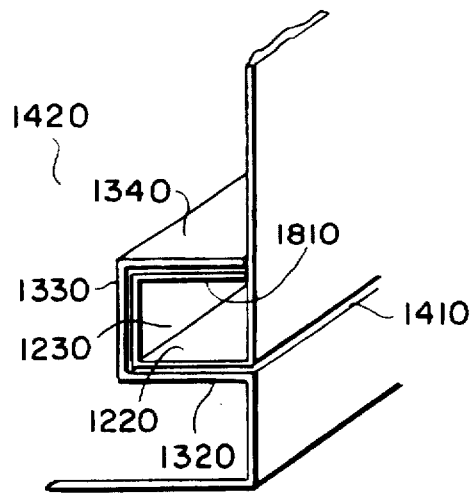
FIG. 18 is an isometric section view of another alternative tongue and groove joint.

In FIG. 18, the alternative embodiment has the downward facing surface of lateral tongue portion 1220 mating with the upward facing surface of first lateral groove portion 1320, the inward facing surface of upright tongue portion 1230 mating with the outward facing surface of upright groove portion 1330, and the upward facing surface of second lateral tongue portion 1810 mating with the downward facing surface of second lateral groove portion 1340.

In FIG. 19, the alternative embodiment has tongue and groove joint 1420 formed on the exterior of enclosure 110.

In a second exemplary embodiment of the invention, an enclosure 110 made of plastic is hereafter described.

Figure 20:
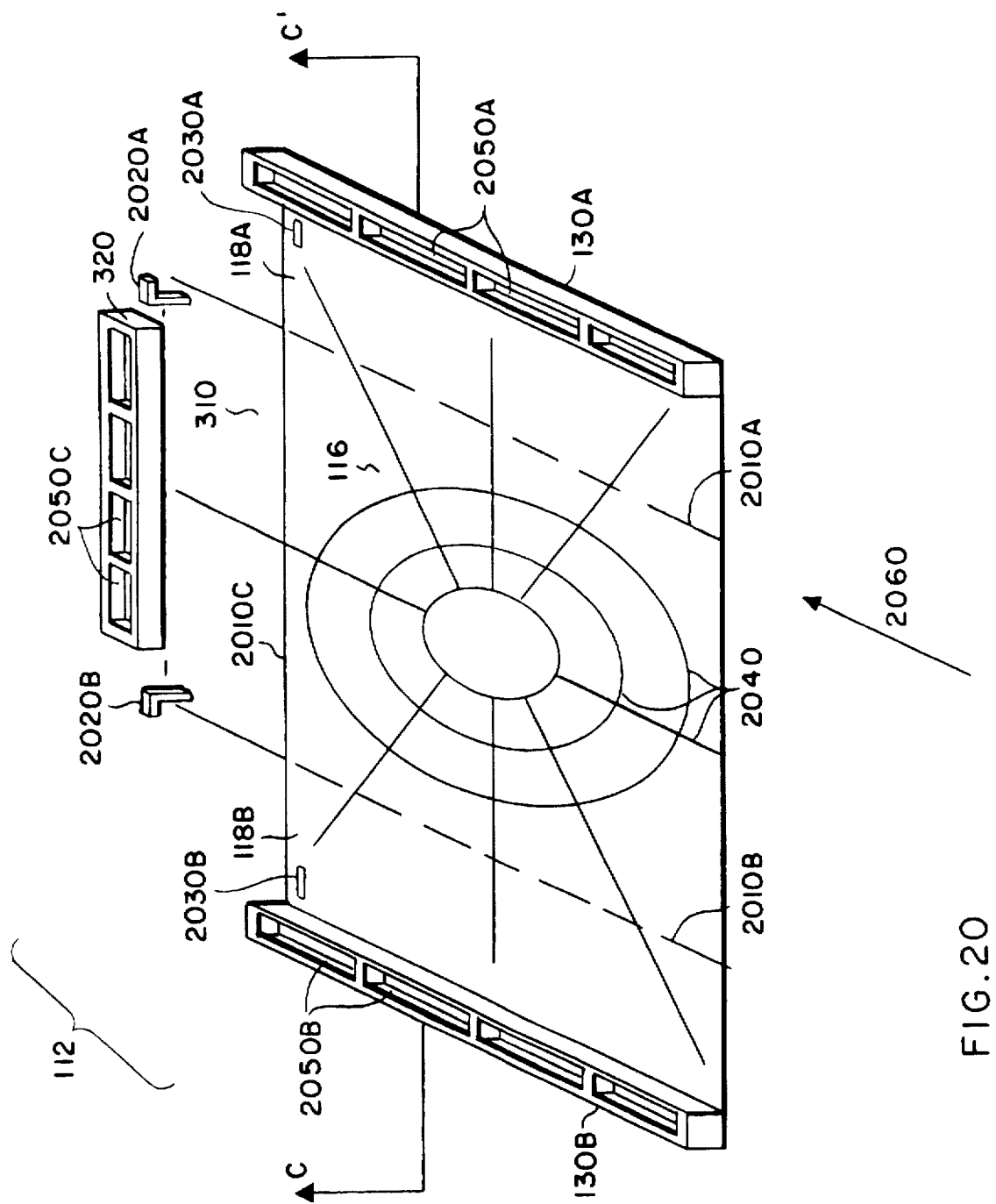
FIG. 20 is an isometric view of the interior of a cover chassis made of plastic prior to the folding of the walls.

FIG. 20, shows a plastic embodiment of cover 112 as it may be formed by plastic injection molding. Tongues 130A, 130B, 320 have a more block-like form than their corresponding tongues of the metal embodiment described earlier. Cavities 2050A, 2050B, 2050C are formed in tongues 130A, 130B, 320, respectively, to facilitate an even flow of injected plastic and to enhance uniform drying during the plastic injection molding process. The arrangement and shape of cavities 2050A, 2050B, 2050C also provide firm tongue structure. Other cavity shapes and arrangements may also be used to produce similar results. Living hinges 2010A, 2010B, 2010C are formed in cover 112 for creating side walls 118A, 118B, and front wall 310, respectively. A spider web-like pattern of raised plastic ridges emanate outwardly from the center of top wall 116 onto walls 118A, 118B, 310 to provide strength to cover 112 and facilitate an even flow of plastic during the injection process. Other ridge patterns may be used to achieve similar results. Snaps 2020A, 2020B project from front wall 310 and secure walls 118A, 118B, 310 by snapping into corresponding slots 2030A, 2030B, respectively, after the walls have folded along living hinges 2010A, 2010B, 2010C. Other snap and slot types and arrangements may be used to secure the walls during the formation of cover 112.

Figure 21:
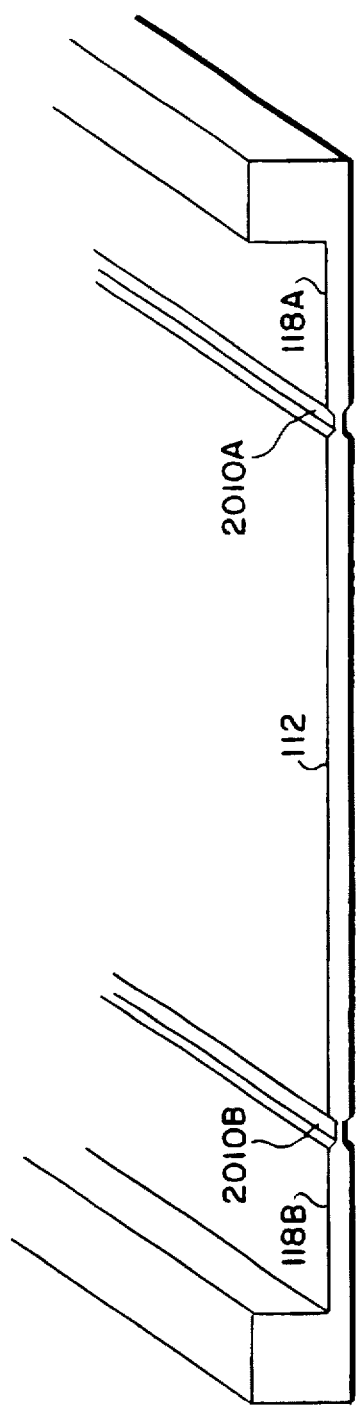
FIG. 21 is a cross section view along line CC' in FIG. 20 of a living hinge prior to the hinge's folding.
Figure 22:
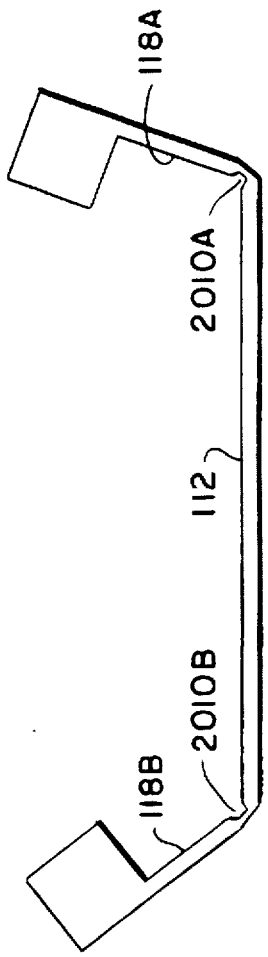
FIG. 22 is a cross section view along line CC' in FIG. 20 of living hinges in the process of folding.

FIGS. 21 and 22 are cross sectional views CC' (see FIG. 21) of cover 112 along the direction of arrow 2060 showing living hinges 2010A, 2010B formed along the full lengths of walls 118A, 118B, 310 where the plastic pinches together. FIG. 22 shows how living hinges 2010A, 2010B fold during the formation of walls 118A, 118B, respectively. Living hinge 2010C operates in similar fashion to living hinges 2010A, 2101B, when folding to form wall 310.

Figure 23:
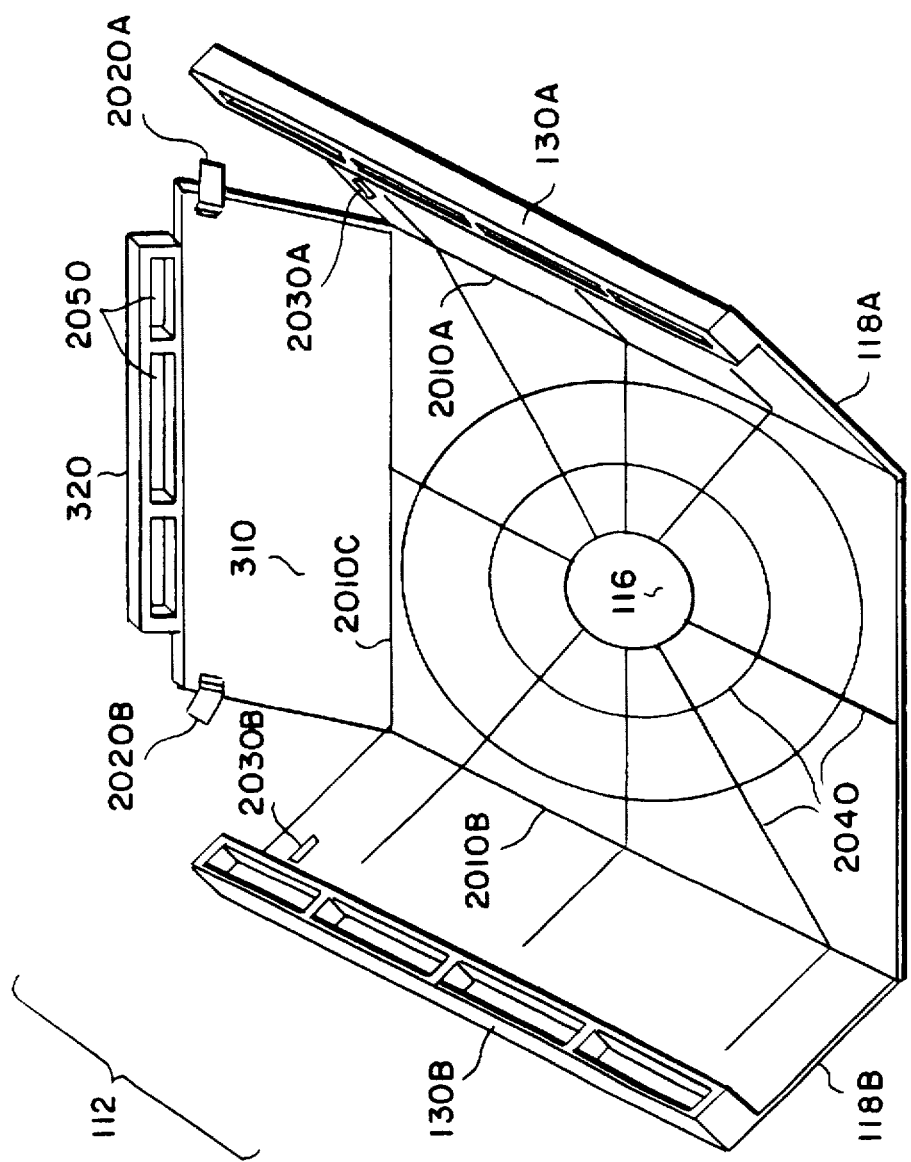
FIG. 23 is an isometric view of the interior of a cover chassis made of plastic as the walls are folding.

FIG. 23 shows cover 112 of FIG. 20 being formed. Walls 118A, 118B, 310 are being formed by the folding of cover 112 along living hinges 2010A, 2010B, 2010C, respectively. A fully formed and secured cover 112 closely resembles the corresponding cover of the metal embodiment shown in FIG. 2.

Figure 24:
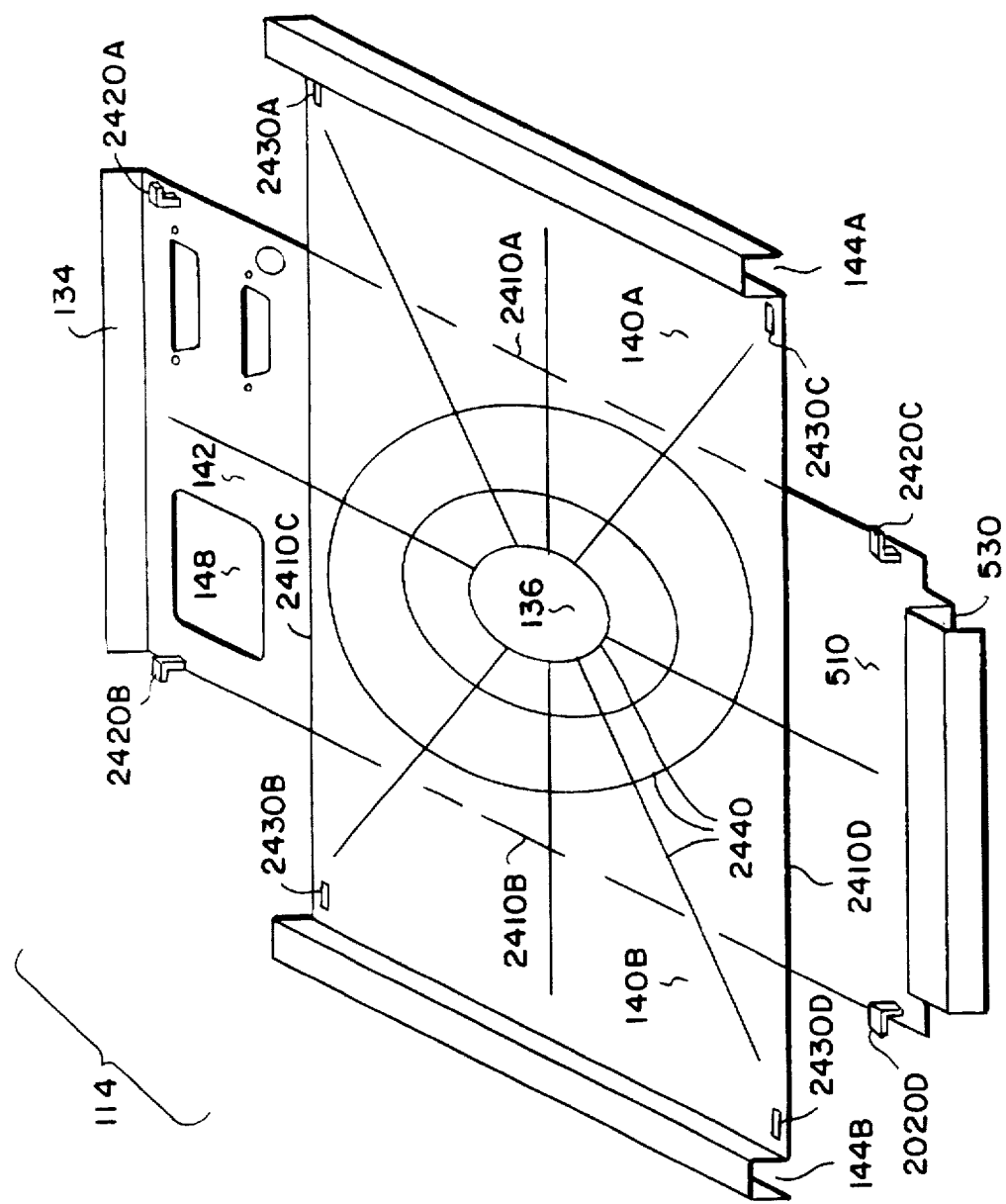
FIG. 24 is an isometric view of the interior of a base chassis made of plastic prior to the folding of the walls.
Figure 25:
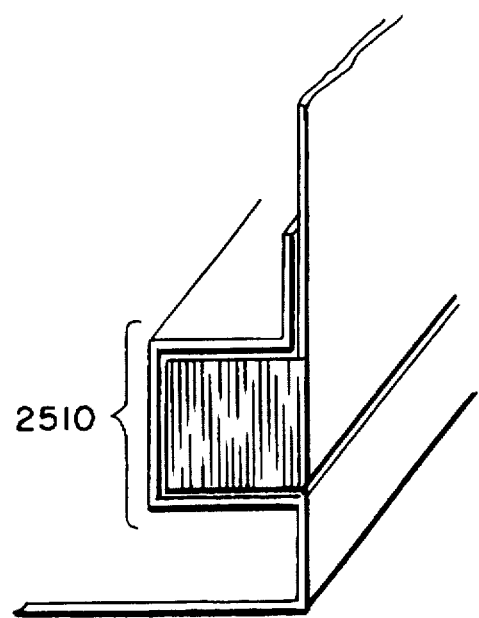
FIG. 25 is an isometric section view of a plastic embodiment of a tongue and groove joint.

Referring now to FIGS. 24 and 25: FIG. 24 shows a plastic embodiment of base 114 as it may be formed by plastic injection molding. Grooves 144A, 144B, 530 have a similar form as the corresponding grooves in the metal embodiment described earlier, and accept tongues 130A, 130B, 320, respectively, as shown in FIG. 20, to form tongue and groove joints like tongue and groove joint 2510. Living hinges 2410A, 2410B, 2410C, 2410D are formed in base 114 for creating side walls 140A, 140B, rear wall 142, and front wall 510, respectively. A spider web-like pattern of raised plastic ridges emanate outwardly from the center of bottom wall 136 onto walls 140A, 140B, 142, 510 to provide strength to base 114 and facilitate an even flow of plastic during the injection process. Other ridge patterns may be used to achieve similar results. Snaps 2420A, 2420B, 2420C, 2420D project from walls 142, 510 and secure walls 140A, 140B, 142, 510 by snapping into corresponding slots 2430A, 2430B, 2430C, 2430D, respectively, after the walls have folded along living hinges 2410A, 2410B, 2410C, 2410D. Other snap and slot types and arrangements may be used to secure the walls during the formation of base 114.

Figure 26:
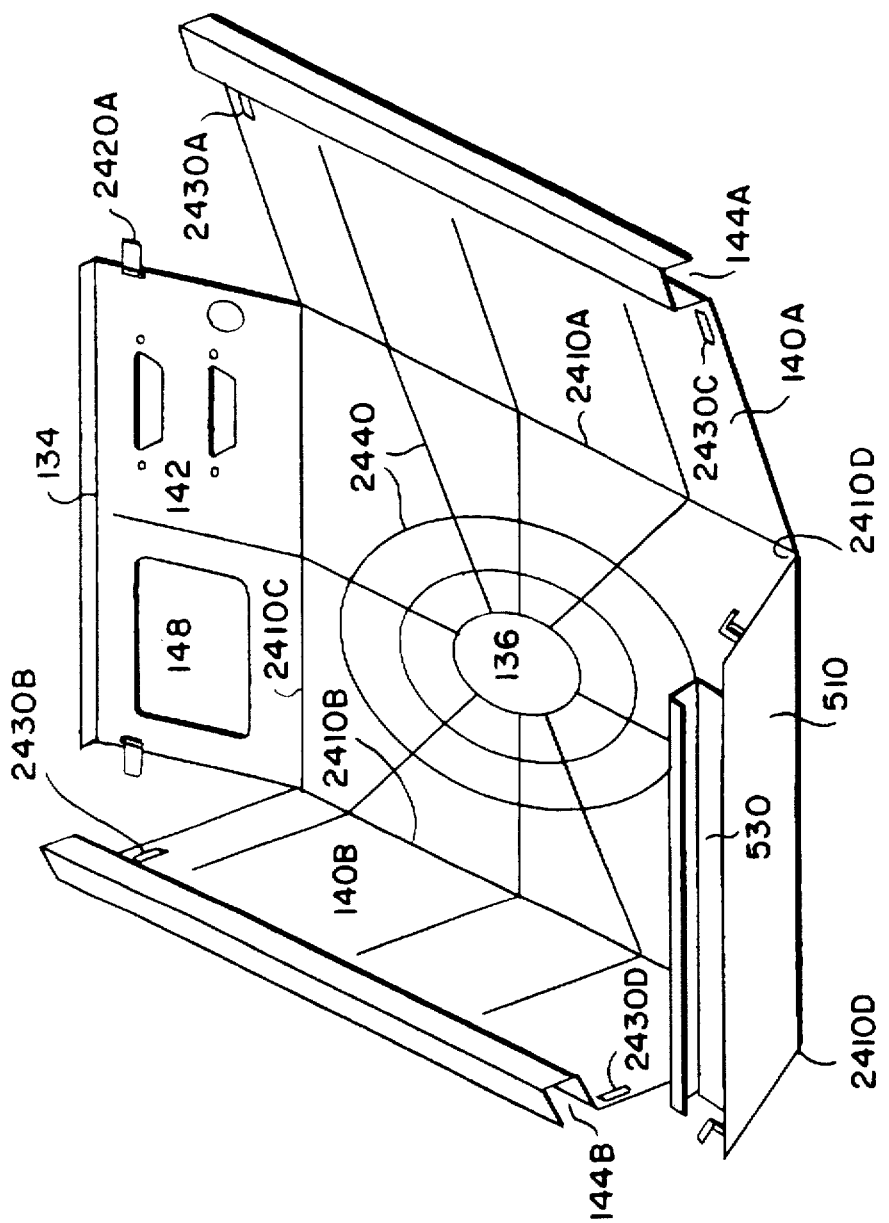
FIG. 26 is an isometric view of the interior of a base chassis made of plastic as the walls are folding.

FIG. 26 shows base 114 of FIG. 24 in the process of being formed. Walls 140A, 140B, 142, 510 are being formed by the folding of base 114 along living hinges 2410A, 2410B, 2410C, 2410D, respectively. A fully formed and secured base 114 closely resembles the corresponding cover of the metal embodiment shown in FIG. 5.

Both cover 112 and base 114 can be made to be electrically conductive by a variety of processes, such as, for example, dipping them into copper. Other methods for making electrically conductive plastic, such as electric arc spraying, vapor deposition, including conductive material in the plastic, etc., may be used.

Figure 27:
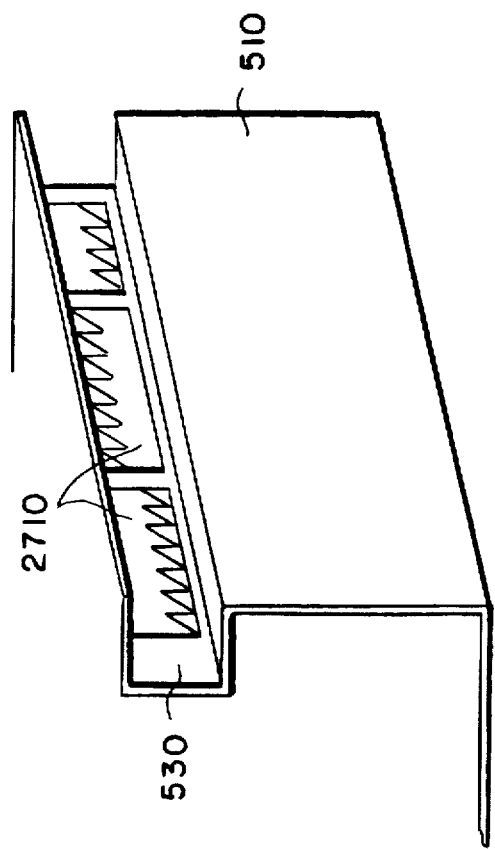
FIG. 27 is an isometric view of finger stocks mounted within the front groove.
Figure 28:
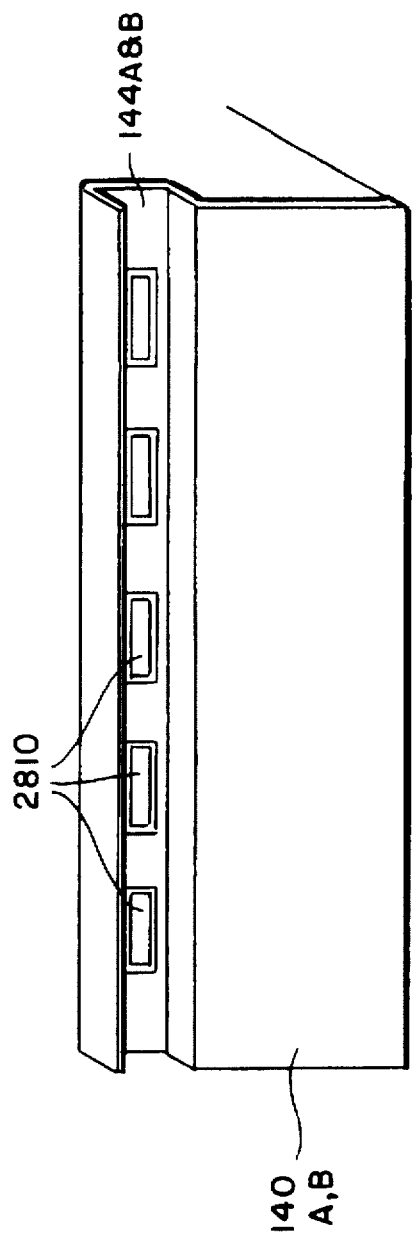
FIG. 28 is an isometric view of finger stocks mounted within a side groove.

FIGS. 27 and 28 show how finger stocks can be added to an embodiment of the invention to increase the electrical contact between cover 112 and base 114. In FIG. 27, finger stocks 2710 are placed within front groove 530 resulting in improved electrical contact between tongue 320 and groove 530 when cover 112 and base 114 are completely closed. In FIG. 28, finger stocks 2810 are placed within side grooves 144A, 144B so as to improve electrical contact between tongues 130A, 130B and grooves 144A, 144B, respectively, when cover 112 and base 114 are slidably joined together. Other types and arrangements of finger stocks within grooves 144A, 144B, 320 may be used to achieve similar results.

EMI Shielding

Tongue and groove joints like those shown in FIGS. 1–28 can be used to provide effective electromagnetic interference, EMI, shielding for enclosures containing emissions over a range of frequencies.

Figure 29:
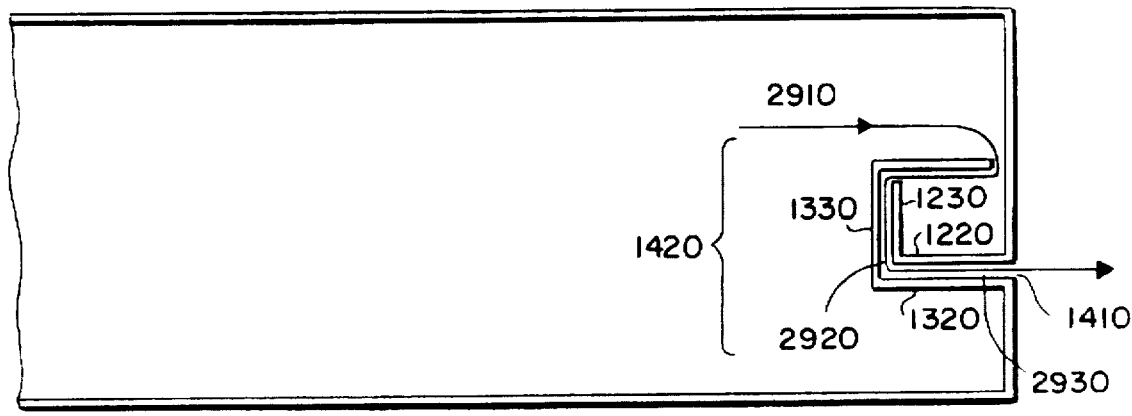
FIG. 29 is a cross section view of a tongue and groove joint.

Referring now to FIG. 29, a cross sectional view of tongue and groove joint 1420 is shown. As an alternative, joint 1420 has a degree of misfit or gaps 2920, 2930 between mating surfaces 1220 and 1320 and between mating surfaces 1230 and 1330. Gaps 2920, 2930 are greatly exaggerated in FIG. 29 so as to aid the present description. Gaps 2920, 2930 form a tortuous path 2910. Tortuous path 2910 forms a waveguide for electromagnetic radiation leaking out of enclosure 110 through tongue and groove joint 1420.

The waveguide formed by the tortuous path 2910 transmits electromagnetic waves according to rectangular waveguide principles as described on page 99 of *Applied Electromagnetism* by Liang Chi Shen, published in 1983 by PWS Publishers of 20 Park Plaza, Boston, Mass. As set forth in the book, the cutoff frequency, $f_c$, for a rectangular waveguide is given by;

$$f_c = \frac{1}{2\sqrt{\mu\epsilon}} \sqrt{\left(\frac{m}{a}\right)^2 + \left(\frac{n}{b}\right)^2}$$

wherein the fundamental mode of a rectangular waveguide is the $TE_{10}$ mode(m=1,n=0), the maximum gap dimension, a, is assumed to be 1 mm, the width of a gap, b, is an order of magnitude larger than a, thereby having a negligible effect upon $f_c$ even for higher modes, and the velocity of a plane wave in free space, $$\frac{1}{\sqrt{\mu\epsilon}},$$

is 3.00E8 m/s. Calculating with the aforementioned values, the theoretical cutoff frequency of the path 2910 is approximately 150 GHz. Electromagnetic radiation at a frequency below the cutoff frequency of the waveguide is attenuated. Inversely, electromagnetic radiation with a wavelength longer than the cutoff wavelength, $$\lambda_c = \frac{c}{f_c}, \text{ wherein } c = \frac{1}{\sqrt{\mu\epsilon}},$$

also does not propagate.

Actual frequencies emitted by electronic parts housed within enclosure 110 are expected to be significantly lower than the theoretical cutoff frequency of the path 2910. With electronic parts operating with signal rise times on the order of 0.1 nanoseconds, the estimated emitted frequency, equal to the inverse of the signal rise time, is 10 GHz, which would not propagate through the aforementioned path 2910.

A similar analysis of pressable tongue and groove joint 1510 shows the EMI shielding effectiveness of the pressable tongue and groove joint 1510 to be substantially equivalent to the EMI shielding effectiveness of the slidable tongue and groove joint 1420.

The previous frequency cutoff calculation assumed a maximum gap dimension of 1 mm, but actual mechanical tolerances for tongue and groove joint 1420, 1520 have been used to keep the maximum gap dimension smaller, at about 0.76 mm (0.030"). Referring to FIGS. 9, 14, and 15, tongue and groove joint 1420, 1510 has been used that has height d, the distance between first lateral groove portion 1320, 720 and second lateral groove portion 1340, 740, that is 0.030 inches greater than height c, the height of upright tongue portion 1230. These dimensions produce a tight mechanical coupling between mating surfaces 1220 and 1320, and between mating surfaces 1220 and 720, along the length of tongue and groove joint 1420, 1510.

Also, enclosure 110 has been used that has width a, the distance between two opposing upright tongue portions 1230, that is 0.030 inches wider than width b, the distance between two opposing upright groove portions 1330. These dimensions produce a tight mechanical coupling between mating surfaces 1230 and 1330 along the length of the tongue and groove joint 1420.

The aforementioned tight mechanical coupling creates a substantially continuous contact and electrical connection between mating surfaces 1220 and 1320, 1220 and 720, 1230 and 1330, and 1230 and 730; thereby creating good electrical conductivity between the cover 112 and base 114, an essential property of an effective EMI shielding enclosure.

The smaller maximum gap dimension due to the above-mentioned 0.030" (0.76 mm) design tolerances results in an increase in the theoretical cutoff frequency of the path 2910 to approximately 200 GHz, and a corresponding decrease in the cutoff wavelength, from approximately 2 mm to 1.5 mm.

Thus, an enclosure with an improved EMI-shielding barrier at the seam between joining chassis portions has been described.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A multipiece construction for a wall of an enclosure for housing electronic components, comprising:
    a first side portion having a major surface, the first side portion having a longitudinal groove at the major surface and extending along an edge region thereof, the groove having spaced apart longitudinal sidewall regions; and
    a second side portion having a major surface, the second side portion having a tongue at the major surface and extending along an edge region thereof, the tongue having a first tongue portion extending laterally from the second side portion and a second tongue portion extending generally orthogonally from the first tongue portion, the second tongue portion being opposed to and spaced apart from the second side portion, the tongue having a shape and a location on the second side portion effective for the first and the second tongue portions to slide into interengaging relationship with the longitudinal sidewall regions of the groove to join the first and second side portions into a unitary wall of the enclosure with the two major surfaces of the first and second side portions being generally parallel to each other and forming an exterior surface of the unitary wall.

2. The apparatus of claim 1, wherein said first and said second side portions are electrically conductive.

3. The apparatus of claim 2, wherein each of said first and said second side portions is formed from a single piece of plastic.

4. The apparatus of claim 2, further comprising:
    said groove having a finger stock mounted therein for increasing contact between said groove and said tongue.

5. The apparatus of claim 2, further comprising:
    gaps due to mechanical tolerances between said tongue and groove providing a path through which radiation generated within said enclosure may leak out of said enclosure,
    said radiation having a cutoff frequency determined by a waveguide formed by said path.

6. The apparatus of claim 1, wherein each of said first and said second side portions is formed from a single piece of metal.

7. The apparatus of claim 1 wherein the groove has a groove entrance at an end of the groove, and an end of the tongue enters the groove at the groove entrance when initially joining the two side portions.

8. The apparatus of claim 1 wherein the tongue and the groove form a longitudinal tunnel along a seam where the first and second side portions are joined when the first and second tongue portions are in interengaging relationship with the longitudinal sidewall regions of the groove.

9. The apparatus of claim 1, further comprising:
    said groove having a first lateral portion extending laterally from the first side portion, an upright portion extending generally orthogonally from said first lateral portion, and a second lateral portion extending generally orthogonally from said upright portion, said second lateral portion being opposed to and laterally spaced apart from said first lateral portion.

10. The enclosure of claim 9, further comprising:
    said groove having a groove entrance at an end of said groove;
    said first lateral portion having a first beveled portion at said end of said groove, said first beveled portion turning obliquely away from said groove entrance;
    said second lateral portion having a second beveled portion at said end of said groove, said second beveled portion turning obliquely away from said groove entrance;
    said first and second beveled portions are for guiding said tongue into said groove entrance when initially aligning and joining said first and said second side portions.

11. The enclosure of claim 1 wherein the major surface of the first side portion is coplanar with the major surface of the second side portion when the first and second side portions are joined.

12. The apparatus of claim 1 wherein the tongue and the groove are at the exterior surface of the unitary wall when joined.

13. An enclosure for housing electronic components, comprising:
    a first chassis portion including a first side portion a second side portion, and a front side portion, the second side portion being opposed to and spaced apart from the first side portion, the front side portion being orthogonal to and joining the first and the second side portions, the first side portion having a major surface and a first longitudinal groove extending along an edge region thereof, the first groove having spaced apart longitudinal sidewall regions, the second side portion having a major surface and a second longitudinal groove extending along an edge region thereof, the second groove having spaced apart longitudinal sidewall regions, the front side portion having a major surface and a longitudinal front groove extending along an end region thereof, the front groove having spaced apart longitudinal sidewall regions; and
    a second chassis portion including a third side portion, a fourth side portion, and a front side portion, the third side portion being opposed to and spaced apart from the fourth side portion, the front side portion of said second chassis portion being orthogonal to and joining the third and the fourth side portions, the third side portion having a major surface and a first tongue extending along an edge region thereof, the first tongue being in the first groove in interengaging relationship with the longitudinal sidewalls regions of the first groove to join the first and third side portions into a first unitary wall of the enclosure with the two major surfaces of the first and third side portions being generally parallel to each other and forming an exterior surface of the first unitary wall, the fourth side portion having a major surface and a second tongue extending along an edge region thereof, the second tongue being in the second groove in interengaging relationship with the longitudinal sidewall regions of the second groove to join the second and fourth side portions into a second unitary wall of the enclosure with the two major surfaces of the second and fourth side portions being generally parallel to each other and forming an exterior surface of the second unitary wall, the front side portion of the second chassis portion having a major surface and a front tongue extending along an end region thereof, the front tongue being in the front groove in interengaging relationship with the longitudinal sidewall regions of the front groove to form a unitary front wall of the enclosure.

14. The apparatus of claim 13 further comprising:
said front groove having a first lateral portion extending laterally from the front side portion of the first chassis portion, an upright portion extending generally orthogonally from said first lateral portion, and a second lateral portion extending generally orthogonally from said upright portion, said second lateral portion being opposed to and laterally spaced apart from said first lateral portion.

15. The apparatus of claim 14, further comprising:
said front groove having a groove entrance along the width of said front groove,
said second lateral portion having a front edge along said groove entrance, said front edge turning obliquely away from said groove entrance for guiding said front tongue into said front groove when said first and second chassis portions are joined to form the enclosure.

16. The apparatus of claim 13 wherein said first chassis portion has a rear portion and a top portion joined orthogonally to the first side portion, the second side portion and the rear portion, said top portion having an interior surface and a blade mounted thereon at an edge region adjacent the rear portion; and
said second chassis portion has a rear side portion, said rear side portion having a lip extending generally orthogonally from said rear side portion, said lip pressing into a longitudinal opening between said blade and said top portion when said first chassis portion and said second chassis portion are joined to form the enclosure.

17. The apparatus of claim 13, further comprising:
said front tongue having a first tongue portion extending laterally from the front side portion of the second chassis portion and second tongue portion extending generally orthogonally from said first tongue portion, the first and second tongue portions sliding into interengaging relationship with the longitudinal sidewall regions of the front groove when the first and second chassis portions are joined.

18. The apparatus of claim 13 wherein the first chassis portion is a base of the enclosure and the second chassis portion is a cover of the enclosure.

19. An enclosure for housing electronic components, comprising:
two unitary walls directly opposed to and spaced apart from each other, each of the unitary walls including:
a first side portion having a major surface, the first side portion having a longitudinal groove at the major surface and extending along an edge region thereof, the groove having spaced apart longitudinal sidewall regions; and
a second side portion having a major surface, the second side portion having a tongue at the major surface and extending along an edge region thereof, the tongue having a first tongue portion extending laterally from the second side portion and a second tongue portion extending generally orthogonally from the first tongue portion, the second tongue portion being opposed to and spaced apart from the second side portion, the tongue being in the groove with the first and second tongue portions in interengaging relationship with the longitudinal sidewall regions of the groove to join the first and second side portions with the two major surfaces of the first and second side portions being generally parallel to each other and forming an exterior surface of one of the unitary walls.

20. An enclosure for a computer system comprising:
a first electrically conductive chassis portion having a first side, said first side having a groove formed therein, said groove having a finger stock mounted therein; and
a second electrically conductive chassis portion having a first side, said first side of second chassis portion having a tongue formed therein, said second chassis portion slidably attached to said first chassis portion with said tongue entering an end of said groove and slidably mating with said groove through a length of said groove to form a slidable tongue and groove joint with said finger stock increasing contact between said groove and said tongue, said first chassis portion and said second chassis portion forming a completed enclosure when slidably connected.

21. A multipiece construction for a wall of an enclosure for housing electronic components, comprising:
a first side portion having a major surface, the first side portion having a longitudinal groove at the major surface and extending along an edge region thereof, the groove having spaced apart longitudinal sidewall regions; and
a second side portion having a major surface, the second side portion having a tongue at the major surface and extending along an edge region thereof, the tongue having a shape and a location on the second side portion effective to slide into interengaging relationship with the longitudinal sidewall regions of the groove, the first and second side portions forming an exterior surface of a unitary wall of the enclosure with the two major surfaces of the first and second side portions being generally parallel and coplanar to each other when the tongue is slid into the groove.

22. An enclosure for housing electronic components, comprising:
a unitary wall including:
a first side portion having a major surface, the first side portion having a longitudinal groove at the major surface and extending along an edge region thereof, the groove having spaced apart longitudinal sidewall regions; and
a second side portion having a major surface, the second side portion having a tongue at the major surface and extending along an edge region thereof, the tongue being in the groove in interengaging relationship with the longitudinal sidewall regions of the groove to join the first and second side portions into the unitary wall of the enclosure with the two major surfaces of the first and second side portions being generally parallel and coplanar to each other and forming an exterior surface of the unitary wall.

23. A multipiece construction for a wall of an enclosure for housing electronic components, comprising:

- a first side portion having a major surface, the first side portion having a longitudinal groove at the major surface extending along an edge region thereof, the groove having spaced apart opposing longitudinal sidewall regions; and

- a second side portion having a major surface, the second side portion having a tongue at the major surface and extending along an edge region thereof, the tongue having a first tongue portion extending laterally from the second side portion and a second tongue portion extending generally orthogonally from the first tongue portion, the tongue having a shape and a location on the second side portion effective to slide into the groove with the first tongue portion and the second tongue portion entering the groove, the first and second side portions forming an exterior surface of a unitary wall of the enclosure with the two major surfaces of the first and second side portions being generally parallel to each other when the tongue is slid into the groove.

24. The construction of claim 23 wherein the groove includes a longitudinal back surface region joining the spaced apart opposing sidewall regions, and the first tongue portion contacts one of the sidewall regions of the groove and the second tongue portion contacts the back surface region of the groove when the tongue is slid into the groove.

25. A method for making a multipiece wall for an enclosure for holding electronic parts, comprising:

forming a longitudinal groove at a major surface of a first side portion and extending along an edge region thereof, the groove having spaced apart longitudinal sidewall regions;

forming a tongue at a major surface of a second side portion and extending along an edge region thereof, the tongue having a first tongue portion extending laterally from the second side portion and a second tongue portion extending generally orthogonally from the first tongue portion, the second tongue portion being opposed to and spaced apart from the second side portion, the tongue having a shape and a location on the second side portion effective for the first and second tongue portions to slide into interengaging relationship with the longitudinal sidewall regions of the groove;

joining said first side portion to said second side portion into a unitary wall of the enclosure with the two major surfaces of the first and second side portions being generally parallel to each other and forming an exterior surface of the unitary wall, the unitary wall providing a barrier to electromagnetic radiation radiated by said electronic parts.

* * * * *